US011251756B2

(12) United States Patent
Leung et al.

(10) Patent No.: US 11,251,756 B2
(45) Date of Patent: Feb. 15, 2022

(54) RECONFIGURABLE RADIO FREQUENCY (RF) INTERFERENCE SIGNAL DETECTOR WITH WIDE DYNAMIC RANGE TRANSCEIVER MODULE

(71) Applicant: QUALCOMM Incorporated, San Diego, CA (US)

(72) Inventors: Lai Kan Leung, San Marcos, CA (US); Aleksandar Miodrag Tasic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 178 days.

(21) Appl. No.: 16/692,975

(22) Filed: Nov. 22, 2019

(65) Prior Publication Data
US 2021/0159861 A1    May 27, 2021

(51) Int. Cl.
*H03F 3/04* (2006.01)
*H03F 3/19* (2006.01)
*H04B 1/18* (2006.01)
*H03F 1/02* (2006.01)

(52) U.S. Cl.
CPC ............ *H03F 3/19* (2013.01); *H04B 1/18* (2013.01); *H03F 1/0244* (2013.01); *H03F 2200/105* (2013.01); *H03F 2200/465* (2013.01)

(58) Field of Classification Search
CPC ............ H03F 3/19; H03F 2200/465; H03F 2200/105; H04B 1/18
See application file for complete search history.

(56) References Cited

U.S. PATENT DOCUMENTS

| 6,856,178 B1 * | 2/2005 | Narayan | H03K 19/018585 326/87 |
| 7,495,475 B2 * | 2/2009 | Suzuki | H03K 19/018528 326/62 |
| 10,447,246 B1 * | 10/2019 | Tripathi | H03K 3/356069 |

\* cited by examiner

*Primary Examiner* — Khanh V Nguyen
(74) *Attorney, Agent, or Firm* — Qualcomm Incorporated

(57) ABSTRACT

A reconfigurable power detector is described. The reconfigurable power detector includes a first power detector circuit. The first power detector circuit includes a pair of coupled first-type transistors to switch a first-type positive output and a first-type negative output. The reconfigurable power detector includes a second power detector circuit. The second power detector circuit includes a pair of coupled second-type transistors to switch a second-type positive output and a second-type negative output. The reconfigurable power detector includes a switch matrix. The switch matrix includes switches to select the second-type positive output and the second-type negative output in a first configuration, the first-type positive output and the first-type negative output in a second configuration, and the first-type positive output and the second-type positive output in a third configuration. The reconfigurable power detector also includes a configuration block to program the switches to select an output configuration at a detector output.

20 Claims, 10 Drawing Sheets

RECONFIGURABLE RADIO FREQUENCY (RF) INTERFERENCE SIGNAL DETECTOR WITH WIDE DYNAMIC RANGE TRANSCEIVER MODULE

BACKGROUND

Field

The present disclosure relates generally to electronics, and more specifically, a reconfigurable power detector with a wide dynamic range transceiver module.

Background

Wireless communications devices, which may include one or more transmitters and/or receivers, have one or more antennas capable of transmitting and receiving radio frequency (RF) signals over a variety of wireless networks and associated bandwidths. These antennas may be used for fifth generation (5G) millimeter wave (mmW) communications, wireless local area network (WLAN) communications (e.g., 802.11ad and/or 802.11ay), and/or other communications, such as fourth generation (4G) and third generation (3G) wireless communications. In 3G, 4G, and 5G receivers, signal-to-noise ratio (SNR) can change significantly in the presence of jammer signals. A jammer/power detector with good dynamic range to program a receiver configuration under jammer conditions is desired. Similarly, in the transmitters, a precise power detector with good dynamic range is desired to monitor and regulate the output power.

SUMMARY

A reconfigurable power detector is described. The reconfigurable power detector includes a first power detector circuit. The first power detector circuit includes a pair of coupled first-type transistors to switch a first-type positive output and a first-type negative output. The reconfigurable power detector includes a second power detector circuit. The second power detector circuit includes a pair of coupled second-type transistors to switch a second-type positive output and a second-type negative output. The reconfigurable power detector includes a switch matrix. The switch matrix includes switches to select the second-type positive output and the second-type negative output in a first configuration, the first-type positive output and the first-type negative output in a second configuration, and the first-type positive output and the second-type positive output in a third configuration. The reconfigurable power detector also includes a configuration block to program the switches to select an output configuration at a detector output.

A method for power detection is described. The method includes switching a first pair of coupled first-type transistors to drive a first-type positive output and a first-type negative output. The method also includes switching a second pair of coupled second-type transistors to drive a second-type positive output and a second-type negative output. The method further includes dynamically selecting an output configuration. The output configuration is selected as the first-type positive output and the first-type negative output, the second-type positive output and the second-type negative output, or the first-type positive output and the second-type positive output according to a detector input power range.

A reconfigurable power detector is described. The reconfigurable power detector includes a first power detector circuit. The first power detector circuit includes a pair of coupled first-type transistors to switch a first-type positive output and a first-type negative output. The reconfigurable power detector includes a second power detector circuit. The second power detector circuit includes a pair of coupled second-type transistors to switch a second-type positive output and a second-type negative output. The reconfigurable power detector includes a switch matrix. The switch matrix includes switches to select the second-type positive output and the second-type negative output in a first configuration, the first-type positive output and the first-type negative output in a second configuration, and the first-type positive output and the second-type positive output in a third configuration. The reconfigurable power detector also means for configuring the switches to select an output configuration at a detector output.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
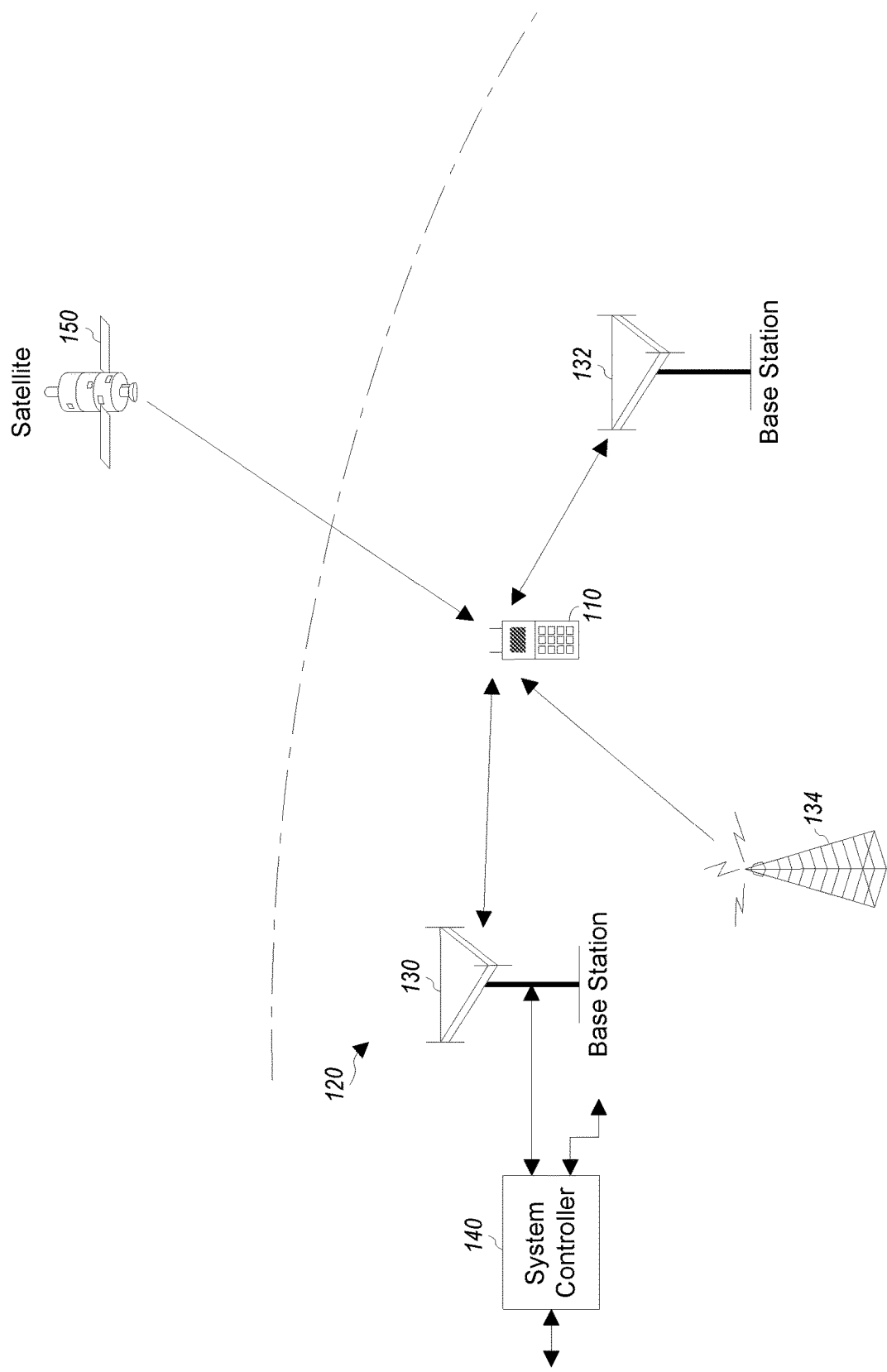
FIG. 1 illustrates a wireless device communicating with wireless systems.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Wireless communications may be transmitted over a multitude of different frequencies and bands. Communications may be transmitted using a millimeter wave (mmW) signal, for example, somewhere in the 24-60 gigahertz (GHz) range or higher. Such communications are, in some circumstances, transmitted with a large bandwidth. The large bandwidth enables wireless transmission of a high volume of information. As a result, multiple applications specifying transmission of large amounts of data can be developed using wireless communications having a wavelength in the millimeter range.

Wireless communications devices may include antennas capable of transmitting and receiving radio frequency (RF) signals over a variety of wireless networks and associated bandwidths. These antennas may be used for fifth generation (5G) communications, wireless local area network (WLAN) communications (e.g., 802.11ad and/or 802.11ay), and/or other communications, such as fourth generation (4G) and third generation (3G) wireless communications. These RF signals may include desired signals as well as interfering signals.

A desired signal may include a transmitted signal to be received by a wireless communications device. An interfering signal may be a transmitted signal not intended for reception by the wireless communications device. The input RF signal may include a jammer signal, which is an interfering signal having a different amplitude (e.g., much larger) than that of a desired signal and located close in frequency to the desired signal. Jammer signals can be introduced by internal or external sources. An internal jammer signal is a jammer signal that is introduced by the receiver. An example is a clock spur generated by a voltage controlled oscillator (VCO) within the receiver. An external jammer signal is a jammer signal that is introduced by a source external to the receiver. An example is a signal transmitted by a transmitter in another communications device that generates out-of-band emissions in the receive frequency band of the receiver.

In 3G, 4G, and 5G receivers, a signal-to-noise ratio (SNR) changes significantly in the presence of jammer signals. Conventional jammer/power detectors, however, lack sufficient dynamic range to program a receiver configuration under jammer conditions. Similarly, in transmitters, conventional power detectors lack sufficient dynamic range to monitor and regulate transmitter output power. Aspects of the present disclosure are directed to a reconfigurable interferer signal detector (e.g., power detector) with a wide dynamic range. In one aspect of the present disclosure, a configuration block varies a detector output configuration according to a detector input power range. One of the detector output configurations may double a gain of the reconfigurable interferer signal detector.

FIG. 1 illustrates a wireless device 110, including the reconfigurable power detector, communicating with a wireless communications system 120. The wireless communications system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communications system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communications system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communications such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
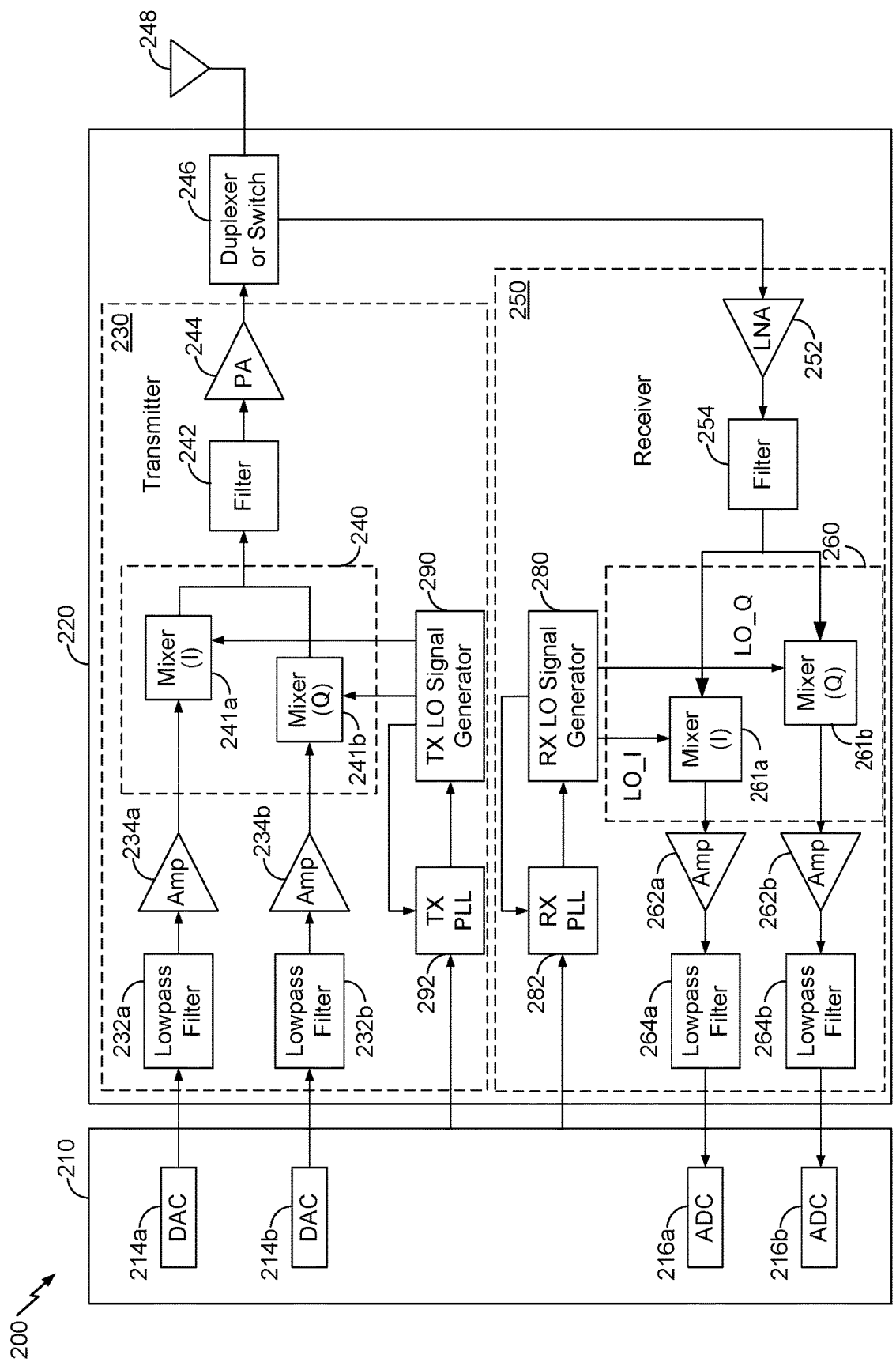
FIG. 2 illustrates a block diagram of the wireless device in FIG. 1.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communications. In general, the wireless device 200 may include any number of transmitters and/or receivers for any number of communications systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog-converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to remove undesired images caused by the prior digital-to-analog conversion Amplifiers (Amp) 234a and 234b amplify the signals from lowpass filters 232a and 232b, respectively, and provide in-phase (I) and quadrature (Q) baseband signals. Upconverters 240 include an in-phase upconverter 241a and a quadrature upconverter 241b that upconverter the in-phase (I) and quadrature (Q) baseband signals with in-phase (I) and quadrature (Q) transmit (TX) local oscillator (LO) signals from a TX LO signal generator 290 to provide upconverted signals. A filter 242 filters the upconverted signals to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communications signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconverters 260 include an in-phase (I) mixer 261a and a quadrature (Q) mixer 261b to mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

Figure 3:
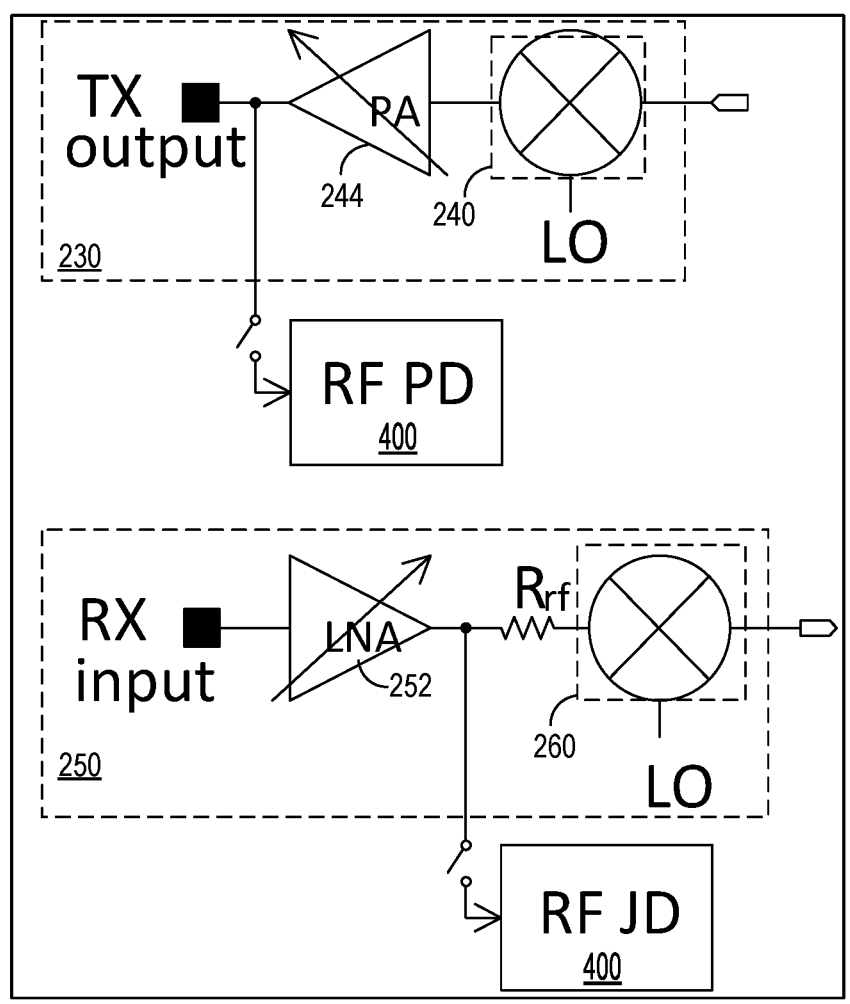
FIG. 3 shows an exemplary design of the wireless device, including a reconfigurable jammer detector and a reconfigurable power detector, according to aspects of the present disclosure.

FIG. 3 shows an exemplary design of the wireless device 200, including a reconfigurable jammer detector and a reconfigurable power detector, according to aspects of the present disclosure. A schematic diagram in FIG. 3 illustrates a portion of a wireless device 300, including the transmitter 230 and the receiver 250 of the wireless device 200 of FIG. 2. In this configuration, a reconfigurable interferer signal detector (e.g., power detector) 400 is coupled between the LNA 252 and resistors $R_{rf}$ of the receiver 250. In addition, a reconfigurable interferer signal detector (e.g., power detector) 400 is coupled between the PA 244 and an output (TX output) of the transmitter 230, in accordance with aspects of the present disclosure. Additional details of the transmitter 230 and the receiver 250 are omitted to avoid obscuring details of the present disclosure.

Figure 4:
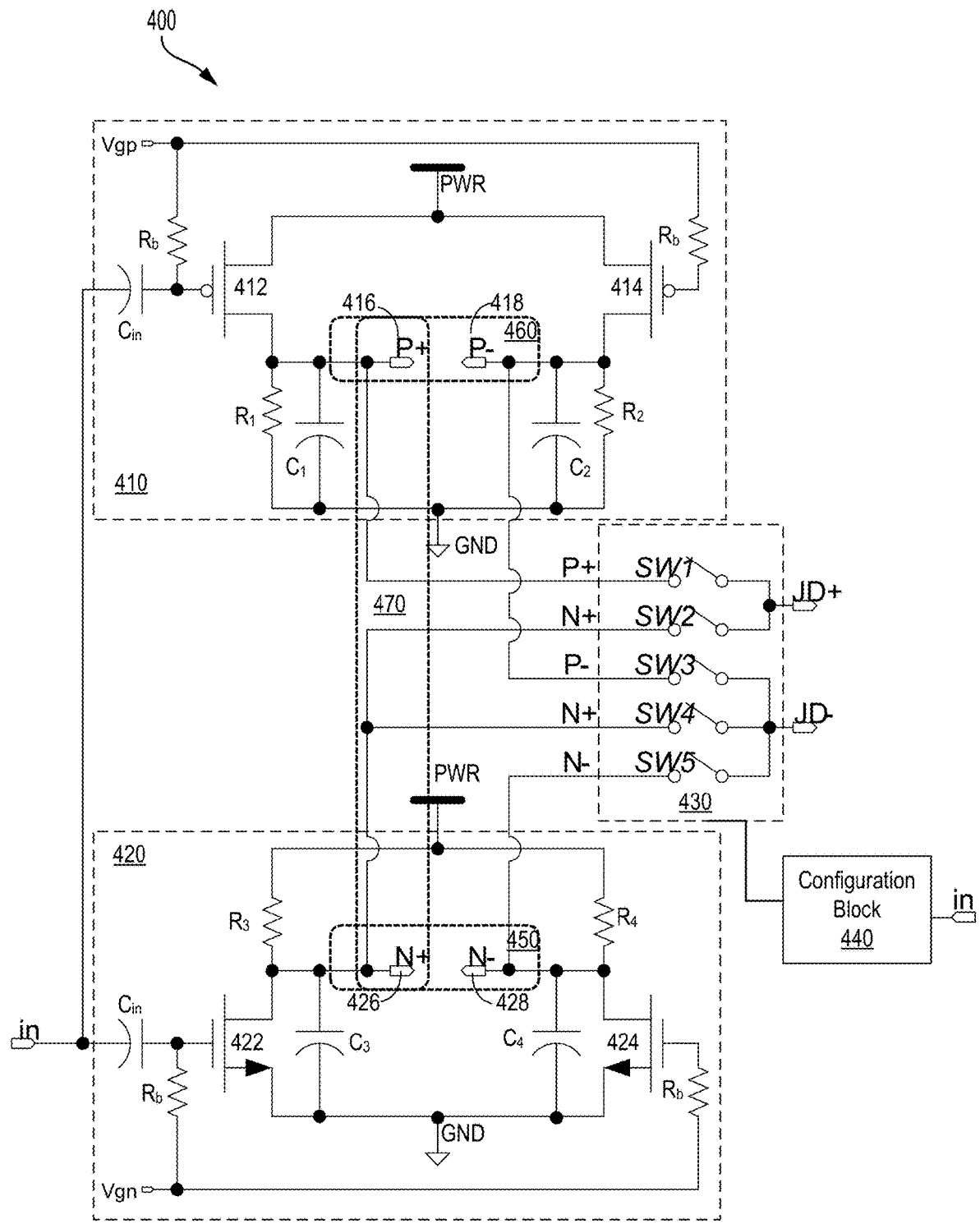
FIG. 4 is a schematic diagram of the reconfigurable power detector of FIG. 3, in accordance with aspects of the present disclosure.

FIG. 4 is a schematic diagram of the reconfigurable interferer (power/jammer) signal detector of FIG. 3, in accordance with aspects of the present disclosure. The reconfigurable interferer signal detector 400 includes a first power detector (PD) circuit 410. The first PD circuit 410 includes a pair of coupled first-type transistors 412, 414 to switch a first-type positive output 416 (P+) and a first-type negative output 418 (P−). In this configuration, the first-type positive output 416 is coupled to a ground rail (GND) through a resistor $R_1$ and a capacitor $C_1$ (e.g., an $R_1C_1$ circuit). In addition, the first-type negative output 418 is coupled to the ground rail through a resistor $R_2$ and a capacitor $C_2$ (e.g., an $R_2C_2$ circuit). The first PD circuit 410 further includes an input capacitor $C_{in}$ and bias resistors $R_b$. In this configuration, the pair of coupled first-type transistors 412, 414 are implemented using p-type metal oxide semiconductor (PMOS) transistors.

The reconfigurable interferer signal detector 400 further includes a second power detector circuit 420, having a pair of coupled second-type transistors 422, 424 to switch a second-type positive output 426 (N+) and a second-type negative output 428 (N−). In this configuration, the second-type positive output 426 is coupled to a power rail (PWR) through a resistor $R_3$ and coupled to the ground rail through a capacitor $C_3$. In addition, the second-type negative output 428 is coupled to the power rail through a resistor $R_4$ and coupled to the ground rail through a capacitor $C_4$. The second power detector circuit 420 also includes an input capacitor $C_{in}$ and bias resistors $R_b$. In this configuration, the pair of coupled second-type transistors 422, 424 are implemented using n-type metal oxide semiconductor (NMOS) transistors.

The second power detector circuit 420 is exemplary of conventional root-mean-square (RMS) power detectors. A radio frequency (RF) signal received at the detector input (in) of the second power detector circuit 420 generally includes a direct current (DC) portion and an analog current (AC) portion. In operation, the second power detector circuit 420 converts RF power from the received RF signal into DC power at the second-type positive output 426 (N+) and the second-type negative output 428 (N−). As a result, the second-type positive output 426 is a function of the input power of the received RF signal; however, the second-type positive output 426 (P+) includes a DC offset voltage component. By contrast, the second-type negative output 428 is limited to a DC offset voltage. In addition, an output of the second power detector circuit 420 is determined by subtracting the second-type negative output 428 from the second-type positive output 426:

$$\text{power detector output} = N+ - N-. \quad (1)$$

According to Equation (1), the DC offset voltage from the second-type negative output 428 (N−) is subtracted from the second-type positive output 426 (N+), which should cancel the DC offset voltage component of the second-type positive output 426 (N+). That is, the pair of coupled second-type transistors 422, 424 are fabricated as matching transistors to produce matching DC offset voltages. Unfortunately, process and temperature variations between the pair of coupled second-type transistors 422, 424 may lead to mismatch between the DC offset voltage component of the second-type positive output 426 and the DC offset voltage of the second-type negative output 428. As a result, the second power detector circuit 420 produces an ambiguous output power range across temperature and process variations. The ambiguous output power range may prevent the power level from being differentiated with a threshold voltage. The second power detector circuit 420 also exhibits a limited dynamic range.

To compensate for these deficiencies, the second power detector circuit 420 is paired with the first PD circuit 410 to form the reconfigurable interferer signal detector 400. In one configuration, a switch matrix 430 is added to the reconfigurable interferer signal detector 400 to program detector output power configurations for different ranges of input power. In this configuration, the switch matrix 430 includes switches (e.g., SW1, SW2, SW3, SW4, and SW5) to program the detector output power configuration.

For example, in a first configuration 450 (e.g., NMOS mode), the switch SW2 and the switch SW5 are closed to select the second-type positive output 426 (N+) and the second-type negative output 428 (N−). In a second configuration 460 (e.g., PMOS mode), the switch SW1 and the switch SW3 are closed to select the first-type positive output 416 (P+) and the first-type negative output 418 (P−). In a third configuration 470 (e.g., PMOS and NMOS mode), the switch SW1 and the switch SW4 are closed to select the first-type positive output 416 (P+) and the second-type positive output 426 (N+). In this aspect of the present disclosure, a configuration block 440 programs the switch matrix 430 to select the detector output configuration at a detector output (e.g., JD+, JD−). Advantageously, a gain at the detector output is increased by subtracting the second-type positive output 426 (N+) from the first-type positive output 416 (P+).

Figure 5:
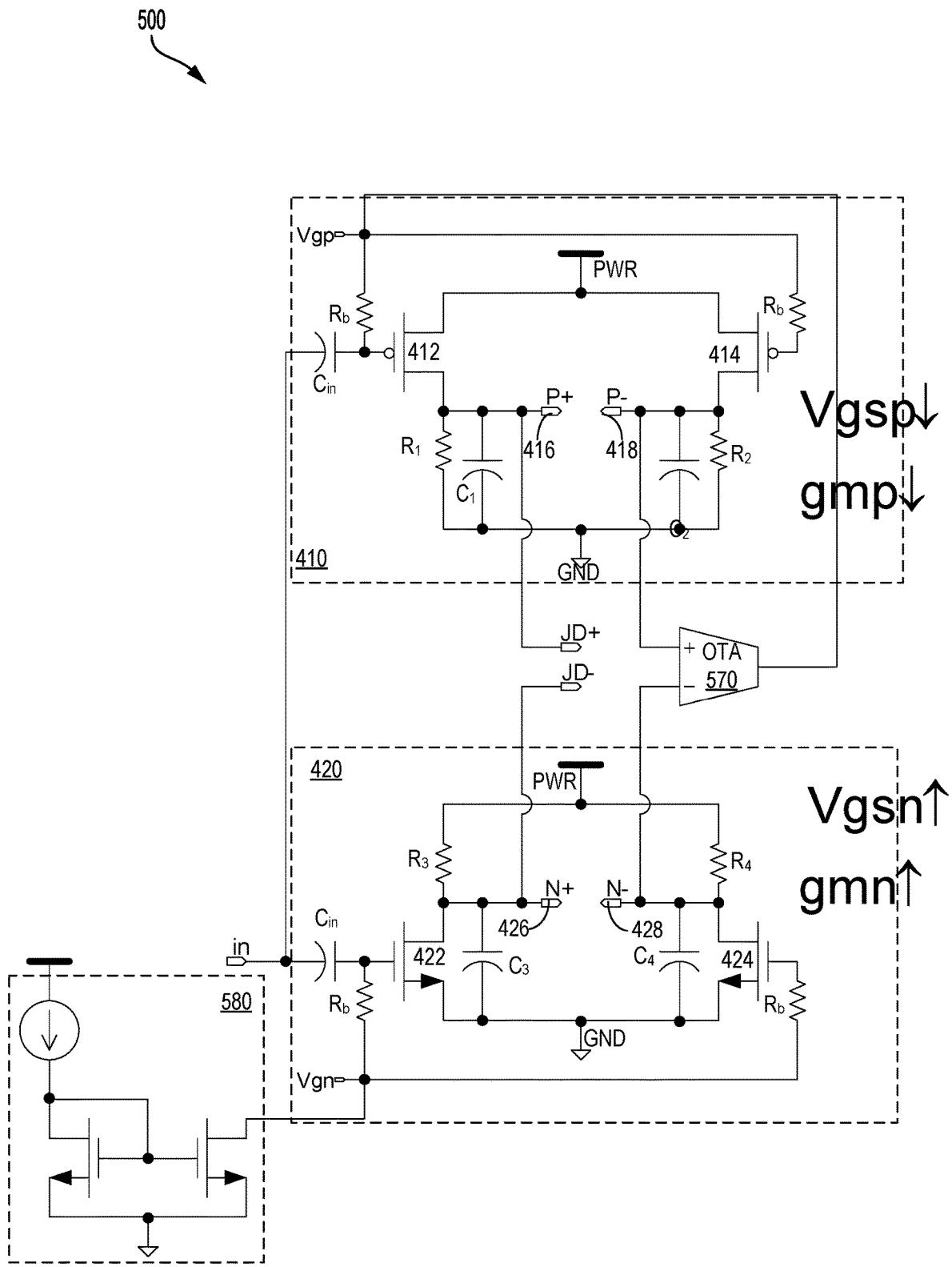
FIG. 5 is a schematic diagram of the reconfigurable power detector of FIG. 4 in a fixed detector output configuration, in accordance with aspects of the present disclosure.

FIG. 5 is a schematic diagram of the reconfigurable interferer signal detector (e.g., power detector) 400 of FIG. 4 in a fixed detector output configuration, in accordance with aspects of the present disclosure. In one configuration, a reconfigurable interferer signal detector (e.g., power detector) 500 illustrates a fixed detector output configuration of the reconfigurable interferer signal detector 400 shown in FIG. 4. As a result, similar elements are illustrated with similar reference numbers.

In this aspect of the present disclosure, the reconfigurable interferer signal detector 500 is shown in the third configuration (e.g., 470, PMOS and NMOS mode). In this example, a positive detector output (JD+) of the reconfigurable interferer signal detector 500 is coupled to the first-type positive output 416 (P+). In addition, a negative detector output (JD−) of the reconfigurable interferer signal detector 500 is coupled to the second-type positive output 426 (N+). In this third configuration, an RF-to-DC gain at the detector output (e.g., JD+, JD−) is increased or doubled according to Equation (1).

As further shown in FIG. 5, the first-type negative output 418 (P−) and the second-type negative output 428 (N−) are prevented from floating. Instead, an amplifier 570 (e.g., an operational transconductance amplifier (OTA)) is coupled to the first-type negative output 418 (P−) and the second-type negative output 428 (N−). The amplifier 570 receives differential input voltages (e.g., P−, N−) to produce an output current. In this configuration, the amplifier 570 forms a direct current (DC) control loop (e.g., a DC bias feedback) configured to equalize the first-type negative output 418 (P−) and the second-type negative output 428 (N−) in response to temperature variation. Device mismatches are also minimized. The DC control loop formed from an output of the amplifier 570 provides a gate bias to control the gate of the first-type transistor 412. In this configuration, the amplifier 570 is configured for equalizing temperature variation.

In one aspect of the present disclosure, the amplifier 570 receives the first-type negative output 418 (P−) as an input. In addition, the amplifier 570 receives the second-type negative output 428 (N−) as a feedback input. In this configuration, the first-type negative output 418 (P−) and the second-type negative output 428 (N−) are equalized by adjusting the gate of the first-type transistor 412. That is, the DC control loop provided by the amplifier 570 is enabled to track changes in a reference gate bias of the pair of coupled first-type transistors 412, 414 (e.g., a gate to source voltage (Vgsp) and a device transconductance (gmp). In addition, the DC control loop tracks changes in the reference gate bias of the pair of coupled second-type transistors 422, 424 (e.g., a gate to source voltage (Vgsn) and a device transconductance (gmn)). In this configuration, a gate of a second-type transistor 422 is controlled by a current mirror 580. In other configurations, a different type of bias circuit can be used. For example, a resistor ladder could replace the current mirror.

Figure 6:
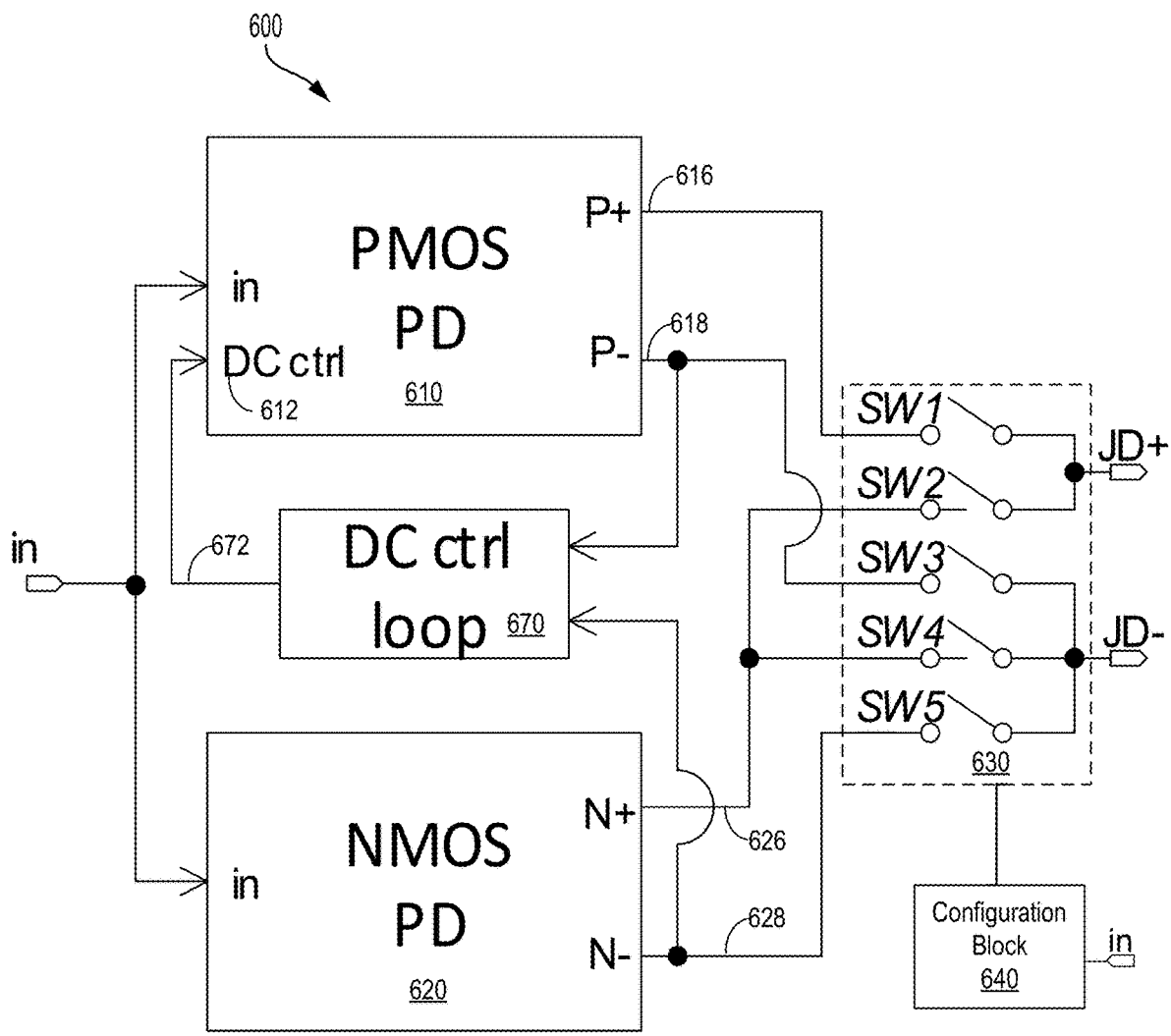
FIG. 6 is a block diagram illustrating a reconfigurable power detector, in accordance with aspects of the present disclosure.
Figure 7B:
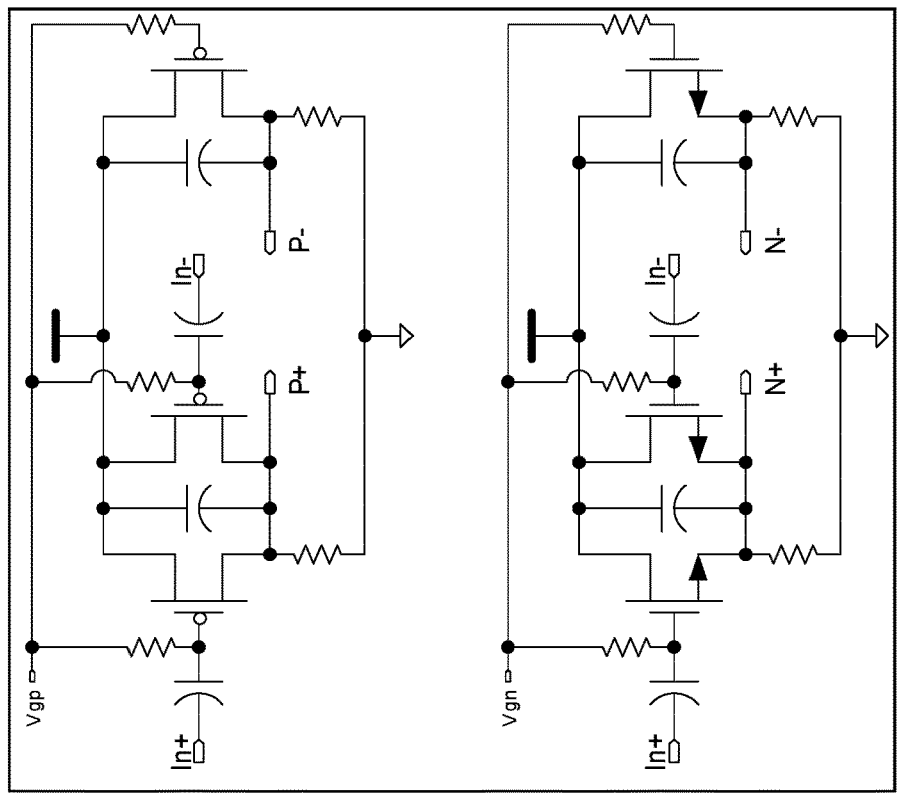
FIGS. 7A and 7B are schematic diagrams illustrating differential common-source and common-drain configurations for a differential, reconfigurable power detector, according to aspects of the present disclosure.
Figure 7A:
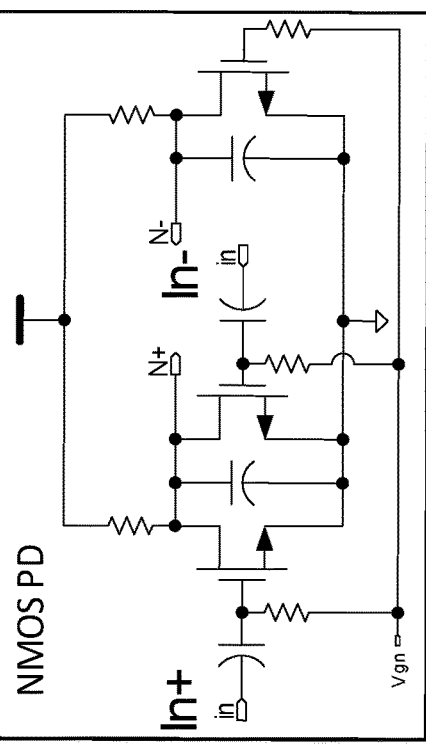

FIG. 6 is a block diagram illustrating a reconfigurable interferer signal detector (e.g., power detector) 600, in accordance with aspects of the present disclosure. The reconfigurable interferer signal detector 600 includes a PMOS power detector (PD) 610. The PMOS PD 610 switches a PMOS positive output 616 (P+) and a PMOS negative output 618 (P−). The reconfigurable interferer signal detector 600 includes an NMOS power detector (PD) 620. The NMOS PD 620 switches an NMOS positive output 626 (N+) and an NMOS negative output 628 (N−). The PMOS PD 610 and NMOS PD 620 may be configured according to a differential (e.g., In+, In−) common-source PD configuration 700, as shown in FIG. 7A. Alternatively, the PMOS PD 610 and NMOS PD 620 may be configured according to a differential (e.g., In+, In−) common-drain PD configuration 750, as shown in FIG. 7B.

To compensate for these deficiencies, the NMOS PD 620 is paired with the PMOS PD 610 to form the reconfigurable interferer signal detector 600. In this configuration, a switch matrix 630 programs detector output power configurations for different ranges of input power. The switch matrix 630 also includes switches (e.g., SW1, SW2, SW3, SW4, and SW5) to program the detector output power configurations. In this aspect of the present disclosure, a configuration block 640 programs the switch matrix 630 to select the detector output configuration at a detector output (e.g., JD+, JD−).

For example, in an NMOS mode, the switch SW2 and the switch SW5 are closed to select the NMOS positive output 626 (N+) and the NMOS negative output 628 (N−). In a PMOS mode, the switch SW1 and the switch SW3 are closed to select the PMOS positive output 616 (P+) and the PMOS negative output 618 (P−). In PMOS and NMOS mode, the switch SW1 and the switch SW4 are closed to select the PMOS positive output 616 (P+) and the NMOS positive output 626 (N+). Advantageously, a gain at the detector output is increased by subtracting the NMOS positive output 626 (N+) from the PMOS positive output 616 (P+).

In one aspect of the present disclosure, a DC control loop 670 receives the PMOS negative output 618 (P−) as an input. In addition, the DC control loop 670 receives the NMOS negative output 628 (N−) as a feedback input. In this configuration, the PMOS negative output 618 (P−) and the NMOS negative output 628 (N−) are equalized to provide a DC control signal 672 to a DC ctrl input 612 of the PMOS PD 610. That is, the DC control loop 670 balances a gate to source voltage (Vgsp) and a device transconductance (gmp) of the PMOS PD 610. In addition, the DC control loop 670 also tracks the gate to source voltage (Vgsn) and a device transconductance (gmn) of the NMOS PD 620. In this configuration, a gate of a second-type transistor 422 (shown in FIG. 4) is controlled by a current mirror 580 (shown in FIG. 5).

FIGS. 7A and 7B are schematic diagrams illustrating differential common-source and common-drain configurations for a differential, reconfigurable interferer signal detector (e.g., power detector), according to aspects of the present disclosure. FIG. 7A shows a differential (e.g., In+, In−) common-source PD configuration 700, which may be used to configure, for example, the PMOS PD 610 and NMOS PD 620 shown in FIG. 6. FIG. 7B shows a differential (e.g., In+, In−) common-drain PD configuration 750, which may be used to configure the PMOS PD 610 and NMOS PD 620, as shown in FIG. 6. These configurations support differential output configurations of the reconfigurable interferer signal detector 600.

Figure 8:
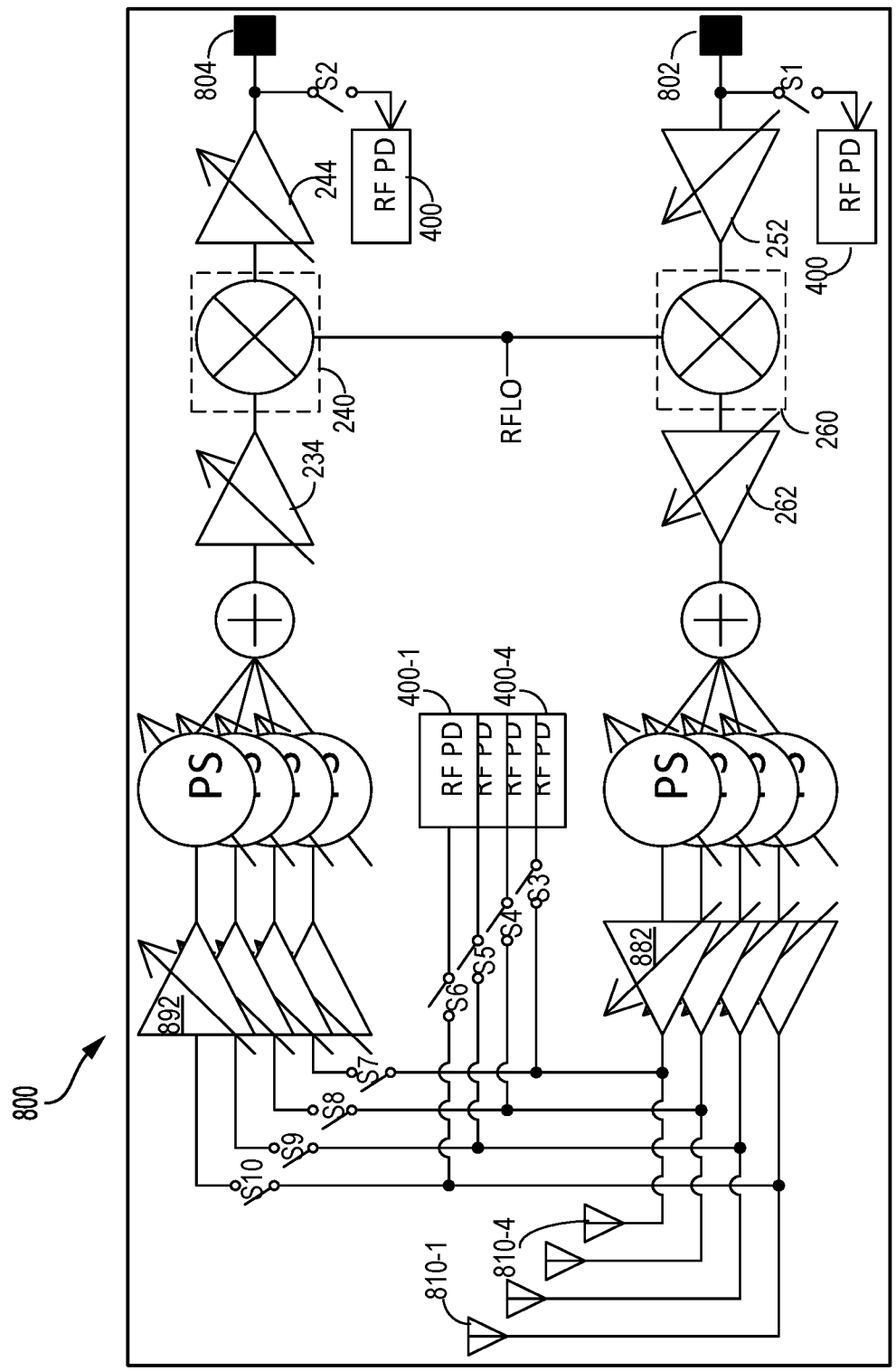
FIG. 8 shows an exemplary design of a fifth generation (5G) millimeter wave (mmW) beamforming receiver/transmitter, including reconfigurable power detectors, according to aspects of the present disclosure.

FIG. 8 shows a design of a fifth generation (5G) millimeter wave (mmW) beamforming receiver/transmitter 800, including reconfigurable power detectors, according to aspects of the present disclosure. In this configuration, the reconfigurable interferer signal detector 400 is coupled between an LNA 252 and a receiver input 802 using a switch 51. In addition, a reconfigurable interferer signal detector 400 is coupled between a PA 244 and a transmitter output 804. Similarly, a reconfigurable interferer signal detector 400 (e.g., 400-1, 400-2, 400-3, 400-4) is selectively coupled by switches ((e.g., S3, S4, S5, S6) to drivers 882 and an antenna 810 ((e.g., 810-1, 810-2, 810-3, 810-4). In addition, the reconfigurable interferer signal detector 400 ((e.g., 400-1, 400-2, 400-3, 400-4) is selectively coupled by switches ((e.g., S7, S8, S9, S10) to drivers 892. Additional details of the transmitter 230 and the receiver 250 are omitted to avoid obscuring details of the present disclosure.

Figure 9:
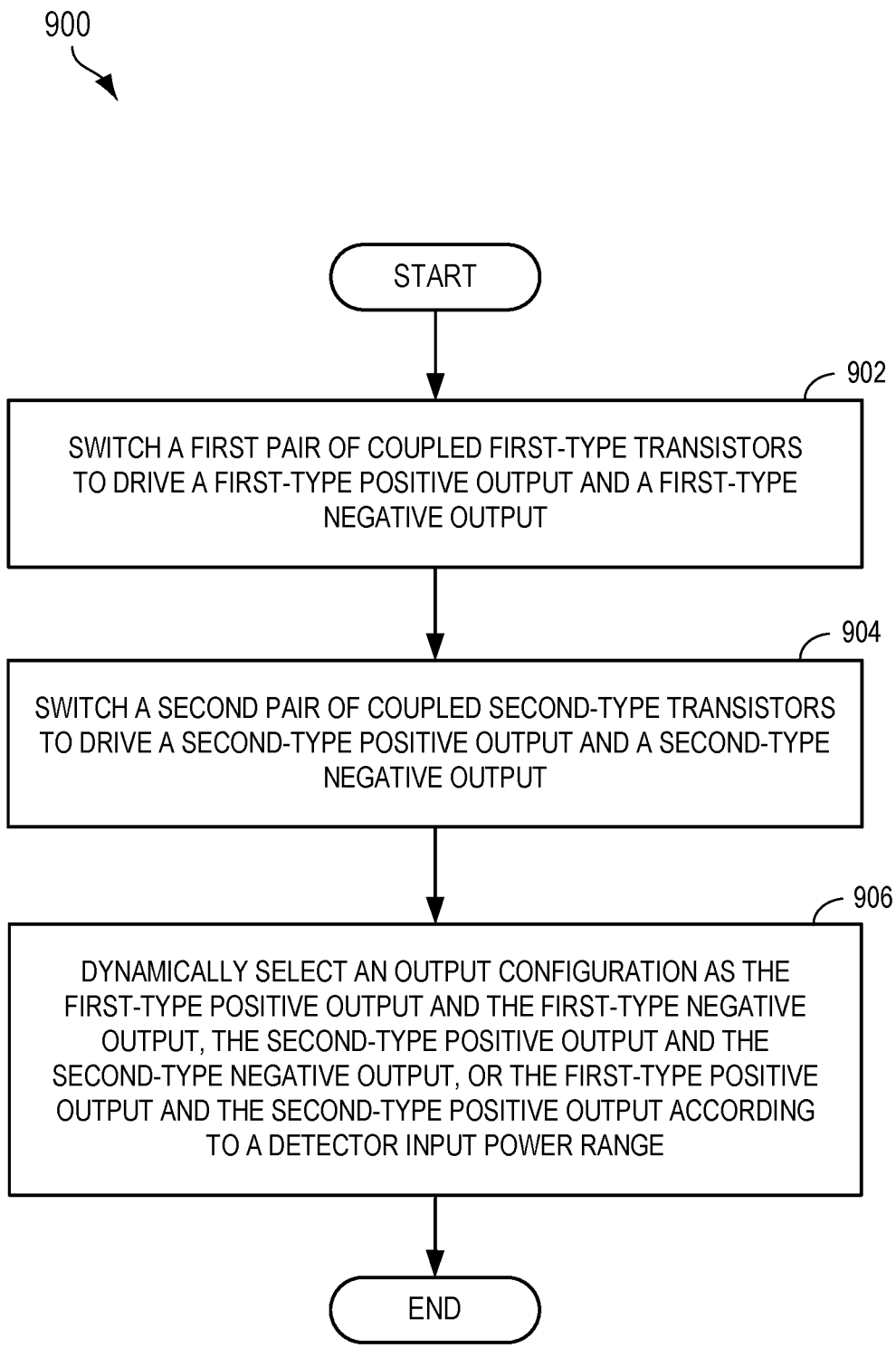
FIG. 9 is a flowchart illustrating a method for reconfigurable power detection, in accordance with aspects of the present disclosure.

FIG. 9 is a flowchart illustrating a method for power detection, in accordance with aspects of the present disclosure. A method 900 begins at block 902, in which a first pair of coupled first-type transistors are switched to drive a first-type positive output and a first-type negative output. For example, as shown in FIG. 4, the pair of coupled first-type transistors 412, 414 switch the first-type positive output 416 (P+) and the first-type negative output 418 (P−). In block 904, a second pair of coupled second-type transistors are switched to drive a second-type positive output and a second-type negative output. For example, as shown in FIG. 4, the pair of coupled second-type transistors 422, 424 switch the second-type positive output 426 (N+) and the second-type negative output 428 (N−).

Referring again to FIG. 9, at block 906, an output configuration is dynamically selected according to a detector input power range. For example, as shown in FIG. 6, in the NMOS mode, the switch SW2 and the switch SW5 are closed to select the NMOS positive output 626 (N+) and the NMOS negative output 628 (N−). In the PMOS mode, the switch SW1 and the switch SW3 are closed to select the PMOS positive output 616 (P+) and the PMOS negative output 618 (P−). In the PMOS and NMOS mode, the switch SW1 and the switch SW4 are closed to select the PMOS positive output 616 (P+) and the NMOS positive output 626 (N+). In addition, the configuration block 640 programs the switch matrix 630 to select the detector output configuration at the detector output (e.g., JD+, JD−). In this configuration, a gain at the detector output is increased by subtracting the NMOS positive output 626 (N+) from the PMOS positive output 616 (P+).

Aspects of the present disclosure are directed to a reconfigurable power detector with a wide dynamic range. In one aspect of the present disclosure, a configuration block varies a detector output configuration according to a detector input power range. One of the detector output configurations may double a gain of the reconfigurable power detector. For example, in PMOS and NMOS mode, the gain is increased or doubled by reducing DC output variation using a DC control loop. In addition, the DC control loop increases a dynamic range of the reconfigurable power detector. For example, when a jammer signal is detected, the reconfigurable power detector may lower a receiver gain. By contrast, when a jammer signal is not detected, the reconfigurable power detector may increase the receiver gain. The PMOS and NMOS mode generally exhibits less variation across temperatures relative to the PMOS mode and the NMOS mode.

According to aspects of the present disclosure, a DC control loop of the described reconfigurable power detector biases the PMOS PD and the NMOS PD in a push-pull manner, as shown in FIG. 5. In particular, the DC control loop reduces the impact of transistor mismatch on the dynamic range of the reconfigurable power detector. As a result, a power-supply rejection ratio (PSRR) is improved. In addition, an output range as well as an overall dynamic range of the reconfigurable power detector are significantly increased. Due to the improved dynamic range, jammer signal power levels are accurately detected. Beneficially, a receiver can be reconfigured with different optimal settings according to the presence/absence of jammer signals, which improves power consumption and signal-to-noise ratio. The reconfigurable power detector may accurately regulate transmitter output power.

According to aspects of the present disclosure, a reconfigurable power detector is described. The reconfigurable power detector includes means for configuring a plurality of switches to select an output configuration at a detector output. The means for configuring may, for example, include the configuration block 640, as shown in FIG. 6. The reconfigurable power detector may also include means for selecting the output configuration as a first configuration, a second configuration, or a third configuration based on a detector input power range. The means for selecting may, for example, include the configuration block 640 of FIG. 6. In another aspect, the aforementioned means may be any layer, module, or any apparatus configured to perform the functions recited by the aforementioned means.

The disclosed reconfigurable power detector may be implemented on an IC, an analog IC, a radio-frequency integrated circuit (RFIC), a mixed-signal IC, an application-specific integrated circuit (ASIC), a printed circuit board (PCB), an electronic device, etc. The reconfigurable power detector may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing a reconfigurable power detector disclosed herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, etc.

Figure 10:
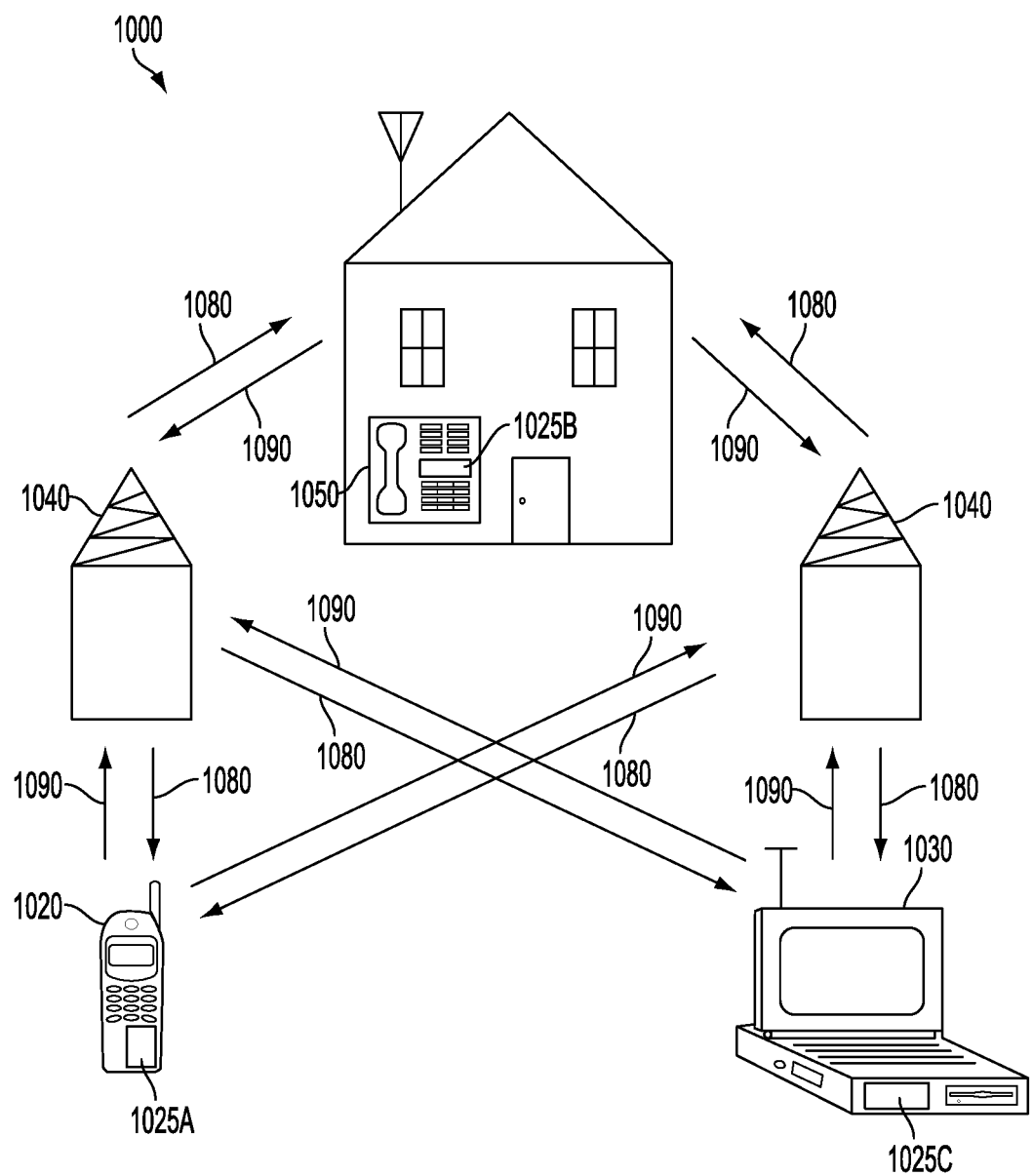
FIG. 10 is a block diagram showing a wireless communications system in which an aspect of the disclosure may be advantageously employed.

FIG. 10 is a block diagram showing an exemplary wireless communications system 1000 in which an aspect of the disclosure may be advantageously employed. For purposes of illustration, FIG. 10 shows three remote units 1020, 1030, and 1050 and two base stations 1040. It will be recognized that wireless communications systems may have many more remote units and base stations. Remote units 1020, 1030, and 1050 include IC devices 1025A, 1025C, and 1025B that include the disclosed reconfigurable power detector. It will be recognized that other devices may also include the disclosed reconfigurable power detector, such as the base stations, user equipment, and network equipment. FIG. 10 shows forward link signals 1080 from the base stations 1040 to the remote units 1020, 1030, and 1050, and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 10 illustrates remote units according to aspects of the present disclosure, the disclosure is not limited to these exemplary illustrated units. Aspects of the present disclosure may be suitably employed in many devices, which include the disclosed reconfigurable power detector.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communications networks and/or communications technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, include compact disc (CD), laser disc, optical disc, digital versatile disc (DVD), floppy disk, and Blu-ray disc, where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. A reconfigurable power detector, comprising:
   a first power detector circuit, having a pair of coupled first-type transistors to switch a first-type positive output and a first-type negative output;
   a second power detector circuit, having a pair of coupled second-type transistors to switch a second-type positive output and a second-type negative output;
   a switch matrix comprising a plurality of switches to select the second-type positive output and the second-type negative output in a first configuration, the first-type positive output and the first-type negative output in a second configuration, and the first-type positive output and the second-type positive output in a third configuration; and
   a configuration block to program the plurality of switches to select an output configuration at a detector output.

2. The reconfigurable power detector of claim 1, in which the configuration block selects the output configuration as the first configuration, the second configuration, or the third configuration based on a detector input power range.

3. The reconfigurable power detector of claim 1, further comprising a direct current (DC) control loop to couple the detector output to a detector input.

4. The reconfigurable power detector of claim 3, in which the DC control loop feeds back around the first power detector (PD) circuit.

5. The reconfigurable power detector of claim 3, in which the DC control loop comprises an operational transconductance amplifier (OTA) coupled to the first-type negative output and the second-type negative output and the first power detector circuit.

6. The reconfigurable power detector of claim 5, in which the OTA is configured to equalize temperature variation to control an offset voltage.

7. The reconfigurable power detector of claim 1, further comprising a current mirror coupled to the second power detector circuit.

8. The reconfigurable power detector of claim 1, in which the detector output comprises a differential output.

9. A method for power detection, comprising:
   switching a first pair of coupled first-type transistors to drive a first-type positive output and a first-type negative output;
   switching a second pair of coupled second-type transistors to drive a second-type positive output and a second-type negative output; and
   dynamically selecting an output configuration as the first-type positive output and the first-type negative output, the second-type positive output and the second-type negative output, or the first-type positive output and the second-type positive output according to a detector input power range.

10. The method for power detection of claim 9, further feeding back a direct current (DC) control loop from a detector output to a detector input.

11. The method for power detection of claim 10, in which the DC control loop feeds back around a first power detector circuit, including the first pair of coupled first-type transistors.

12. The method for power detection of claim 10, further comprising coupling the first-type negative output and the second-type negative output to the detector input of a first power detector circuit, including the first pair of coupled first-type transistors.

13. The method for power detection of claim 12, further comprising equalizing temperature variation to control an offset voltage.

14. A reconfigurable power detector, comprising:
   a first power detector circuit, having a pair of coupled first-type transistors to switch a first-type positive output and a first-type negative output;

a second power detector circuit, having a pair of coupled second-type transistors to switch a second-type positive output and a second-type negative output;

a switch matrix comprising a plurality of switches to select the second-type positive output and the second-type negative output in a first configuration, the first-type positive output and the first-type negative output in a second configuration, and the first-type positive output and the second-type positive output in a third configuration; and means for configuring the plurality of switches to select an output configuration at a detector output.

15. The reconfigurable power detector of claim 14, in which the means for configuring comprises means for selecting the output configuration as the first configuration, the second configuration, or the third configuration based on a detector input power range.

16. The reconfigurable power detector of claim 14, further comprising a direct current (DC) control loop to couple the detector output to a detector input.

17. The reconfigurable power detector of claim 16, in which the DC control loop feeds back around the first power detector circuit.

18. The reconfigurable power detector of claim 16, in which the DC control loop comprises an operational transconductance amplifier (OTA) coupled to the first-type negative output and the second-type negative output and the first power detector circuit.

19. The reconfigurable power detector of claim 18, in which the OTA is configured to equalize temperature variation to control an offset voltage.

20. The reconfigurable power detector of claim 14, in which the detector output comprises a differential output.

* * * * *